United States Patent
Faska et al.

(10) Patent No.: US 6,753,199 B2
(45) Date of Patent: Jun. 22, 2004

(54) TOPSIDE ACTIVE OPTICAL DEVICE APPARATUS AND METHOD

(75) Inventors: Tom Faska, Brookline, NH (US); Greg Dudoff, Amherst, NH (US)

(73) Assignee: Xanoptix, Inc., Merrimack, NH (US)

( * ) Notice: Subject to any disclaimer, the term of this patent is extended or adjusted under 35 U.S.C. 154(b) by 0 days.

(21) Appl. No.: 10/180,383

(22) Filed: Jun. 26, 2002

(65) Prior Publication Data

US 2003/0071272 A1 Apr. 17, 2003

Related U.S. Application Data

(63) Continuation-in-part of application No. 09/896,189, filed on Jun. 29, 2001, now Pat. No. 6,620,642, and a continuation-in-part of application No. 09/897,160, filed on Jun. 29, 2001, and a continuation-in-part of application No. 09/896,983, filed on Jun. 29, 2001, and a continuation-in-part of application No. 09/897,158, filed on Jun. 29, 2001, and a continuation-in-part of application No. 09/896,665, filed on Jun. 29, 2001, now abandoned.

(60) Provisional application No. 60/365,998, filed on Mar. 19, 2002, and provisional application No. 60/366,032, filed on Mar. 19, 2002.

(51) Int. Cl.$^7$ ............................. H01L 21/00; H01S 5/00
(52) U.S. Cl. ............................. 438/28; 438/26; 372/43
(58) Field of Search ........................... 438/26, 27, 28, 438/65, 66; 372/43

(56) References Cited

U.S. PATENT DOCUMENTS

| | | | |
|---|---|---|---|
| 4,533,833 A | | 8/1985 | Copeland et al. |
| 5,100,480 A | * | 3/1992 | Hayafuji ..................... 136/249 |
| 5,266,794 A | | 11/1993 | Olbright et al. |
| 5,269,453 A | | 12/1993 | Melton et al. |

(List continued on next page.)

OTHER PUBLICATIONS

Ahadian, J.F., et al., "Practical OEIG's Based on the Monolithic Integration of GaAs–InGap LED's with Commercial GaAs VLSI Electronics", IEEE Journal of Quantum Electronics, vol. 34, No. 7, pp. 1117–1123, Jul. 1998.

Alduino, A.C. et al., "Quasi–Planar Monolithic Integration of High–Speed VCSEL and Resonant Enhanced Photodetector Arrays", IEEE Photonics Technology Letters, vol. 11, No. 5, pp. 512–514, May 1999.

Anderson, B., "Rapid Processing And Properties Evaluation Of Flip–Chip Underfills", Dexter Electronic Materials, 9 pages.

Corbett, B. et al., "Resonant Cavity Light Emitting Diode and Detector Using Epitaxial Liftoff", IEEE, vol. 5, No. 9, pp. 1041–1043, Sep. 1993.

Geib, K.M. et al., "Monolithically Integrated VCSELs and Photodetectors for Microsystem Applications", IEEE, pp. 27–28, 1998.

Goodman, J. et al., "Optical Interconnections for VLSI Systems", Proceedings of the IEEE, vol. 72, No. 7, pp. 850–865, Jul. 1984.

Goossen, K. W. et al., "GaAs 850 nm Modulators Solder–Bonded to Silicon", IEEE Photonics Technology Letters, vol. 5, No. 7, Jul. 1993.

(List continued on next page.)

*Primary Examiner*—Carl Whitehead, Jr.
*Assistant Examiner*—William Vesperman
(74) *Attorney, Agent, or Firm*—Morgan & Finnegan, LLP

(57) ABSTRACT

A method of integrating a topside optical device, having electrical contacts on a top side, with an electronic chip having electrical contacts on a connection side, involves creating a trench, defined by a wall, from the top side of a wafer containing the topside optical device into a substrate of the wafer, making a portion of the wall conductive by applying a conductive material to the portion; and thinning the substrate to expose the conductive material.

5 Claims, 6 Drawing Sheets

U.S. PATENT DOCUMENTS

| | | | |
|---|---|---|---|
| 5,299,222 | A | 3/1994 | Shannon |
| 5,385,632 | A | 1/1995 | Goossen |
| 5,477,933 | A | 12/1995 | Nguyen |
| 5,485,480 | A | 1/1996 | Kleinerman |
| 5,488,504 | A | 1/1996 | Worchesky et al. |
| 5,499,313 | A | 3/1996 | Kleinerman |
| 5,511,085 | A | 4/1996 | Marshall |
| 5,568,574 | A | 10/1996 | Tanguay, Jr. et al. |
| 5,602,863 | A | 2/1997 | Itagaki |
| 5,636,052 | A | 6/1997 | Arney et al. |
| 5,637,885 | A | 6/1997 | Heinemann et al. |
| 5,715,270 | A | 2/1998 | Zediker et al. |
| 5,729,038 | A | 3/1998 | Young et al. |
| 5,793,789 | A | 8/1998 | Ben-Michael et al. |
| 5,814,889 | A | 9/1998 | Gaul |
| 5,946,130 | A | 8/1999 | Rice |
| 5,991,479 | A | 11/1999 | Kleinerman |
| 6,005,262 | A | 12/1999 | Cunningham |
| 6,048,751 | A | 4/2000 | D'Asaro et al. |
| 6,118,908 | A | 9/2000 | Bischel et al. |
| 6,172,417 | B1 | 1/2001 | Goossen |
| 6,184,066 | B1 * | 2/2001 | Chino et al. ................ 438/118 |
| 6,215,114 | B1 | 4/2001 | Yagi et al. |
| 6,253,986 | B1 | 7/2001 | Brofman |
| 6,283,359 | B1 | 9/2001 | Brofman |
| 6,340,113 | B1 | 1/2002 | Avery et al. |
| 6,343,171 | B1 * | 1/2002 | Yoshimura et al. ........... 385/50 |
| 6,423,561 | B1 | 7/2002 | Chino et al. |
| 6,522,794 | B1 | 2/2003 | Bischel et al. |
| 2001/0020739 | A1 * | 9/2001 | Honda ...................... 257/684 |
| 2001/0038103 | A1 * | 11/2001 | Nitta et al. ................ 257/103 |
| 2001/0081773 | | 6/2002 | Inoue et al. |
| 2002/0081773 | A1 * | 6/2002 | Inoue et al. ................ 438/108 |
| 2002/0126364 | A1 | 9/2002 | Miles |
| 2002/0141011 | A1 | 10/2002 | Green et al. |
| 2002/0154355 | A1 | 10/2002 | Payne et al. |

OTHER PUBLICATIONS

Goossen, K.W. et al., "GaAs MQW Modulators Integrated with Silicon CMOS", IEEE Photonics Technology Letters, vol. 7, No. 4, pp. 360–362, Apr. 1995.

Hibbs–Brenner, M.K., et al., "VCSEL/MSM Detector Smart Pixel Arrays", IEEE, pp. 3 and 4, 1998.

Lesser, M.P. et al., "Bump Bonded Back Illuminated CCDs", SPIE, vol. 1656, pp. 508–516, 1992.

McLaren T. et al., "Assembly of VCSEL Based Smart Pixel Arrays", IEEE/LEOS Summer Topical Meeting: Smart Pixels, pp. 49 and 50, Aug. 1996.

Nakahara, T., et al., "Hybrid Integration of Smart Pixels by Using Polyimide Bonding: Demonstration of a GaAs p–i–n Photodiode/CMOS Receiver", IEEE Journal Of Selected Topics In Quantum Electronics, pp. 209–216, 1999.

Ohsaki, T., "Electronic Packaging in the 1990's—A Perspective From Asia", IEEE Transactions On Components, Hybrids, And Manufacturing Technology, vol. 14, No. 2, pp. 254–261, Jun. 1991.

Pommerrenig, D.H. et al., "Hybrid silicon focal plane development: an update", SPIE, vol. 267, pp. 23–30, 1981.

Pu, R. et al., "Comparison of Techniques for Bonding VCSELs Directly to ICs", SPIE vol. 3490, pp. 498–501, Jun. 2005.

Pu, R. et al., "Hybrid Integration of VCSELs to Foundry Fabricated Smart Pixels", IEEE/LEOS Spring Meetings, pp. 25 and 26, 1997.

Sasaki, J. et al., "Self–aligned Assembly Technology for Optical Devices Using AuSn Solder Bumps Flip–Chip Bonding", pp. 260–261.

International Search Report dated Nov. 7, 2002.
International Search Report dated Dec. 17, 2002.
International Search Report dated Nov. 27, 2002.

* cited by examiner

TOPSIDE ACTIVE OPTICAL DEVICE APPARATUS AND METHOD

CROSS REFERENCE TO RELATED APPLICATIONS

This application claims priority under 35 USC 119(e)(1) of U.S. Provisional Patent Application Serial No. 60/365,998 and U.S. Provisional Patent Application Serial No. 60/366,032, both filed Mar. 19, 2002.

This application is also a continuation-in-part of commonly assigned U.S. patent application Ser. Nos. 09/896,189, now U.S. Pat. No. 6,620,642, 09/897,160, 09/896,983, 09/897,158 and 09/896,665, now abandoned, all filed Jun. 29, 2001.

FIELD OF THE INVENTION

This invention relates to optical devices and, more particularly to integration of active optical devices with other components.

BACKGROUND

Top side emitting/processed devices are ones in which the optical devices are oriented away from the substrate of the wafer on which the devices were formed (i.e. containing the optical devices). Bottom (or back) side emitting/processed devices have the optical devices themselves oriented towards the substrate.

Top side emitting/receiving devices are the common device configuration used by industry and so are more readily available, more easily obtained, and more widely understood and characterized.

Moreover, top side emitting lasers, receiving detectors, or reflective or absorbative modulators can be easily made to operate at wavelengths at which the substrate for the optical devices is opaque, since in these types of devices light does not need to travel through the substrate.

In addition, top side emitting/receiving/processed devices are easier to test than bottom side devices, before integration with electronics, since contacts and optical access are on the same side (top) of the wafer.

The driver and control circuitry for these devices is most commonly fabricated from silicon circuits. The electrical contacts are also on the front (i.e. top) surface of the driver and control circuitry silicon wafer. Where the electrical contacts of top side of the optical devices and driver and control circuitry chip, it is difficult to connect them together. Inverting the top side optical devices would allow electrical interconnection to the driver and control circuitry but prevents correct optical functionality, absent a hole being made in the electronic driver chip.

Others have attempted other ways of integrating of top emitting devices with electronics. One approach to doing so is shown in FIG. 1. In the process of FIG. 1, the process starts with a wafer 100. One or more isolation holes, grooves or trenches 102 are made in the epitaxial layers 104 and contacts 106, 108 are formed on the top surface 110. A superstrate 112 is attached to the upper surface 110 for strength. The substrate 114 of the wafer 100 is then completely removed. The optical devices are then defined in the epitaxial layers 104. Vias or other openings 116 are then made from the bottom (also called the "back") side 118 through the epitaxial layers 104 to the underside contacts 106, 108. After an insulator (not shown) has been applied to the vias 116 as necessary to ensure an electrical short does not occur, conductors 120, 122 are formed on the side of the vias 116 so as to, in effect, provide an ability to connect to the electrical contacts 106, 108 on the bottom side 118 via the conductors 120, 122 and contacts 124, 126 formed on the bottom side 118. Solder can then be applied for connection of the top emitting device to other electrical contacts 130, for example, on a circuit board 132 or another wafer.

The complexity of this approach, the difficulty in attaching a superstrate and keeping that superstrate robust over operational temperature cycling, and difficulty in achieving reasonable yields, make this approach undesirable for commercial application.

Thus, there is a need for a process that can make top side optical devices that can be integrated with electronics that does not suffer form the above problems.

SUMMARY OF THE INVENTION

While, to avoid the thermal problems of the prior art associated with the superstrate, one might consider adapting the prior art approach by an analogous approach of not using a superstrate and etching through the substrate, such as shown in FIG. 2.

In the process of FIG. 2, a wafer 200 is etched and doped to form the optical device 202. Contacts 204, 206 are formed on the device. The substrate 208 is thinned to allow for the etching of vias. Vias 210 are then etched through the substrate 208 until the contacts 204, 206 on the top of the device are reached. A dielectric (not shown) coating is made on the via wall and a conductor material is added into the hole, on top of the dielectric, to form a contacts 212, 214 extending from the back side to the contacts 204, 206 on top. Solder or some other electrically connective material 216 can then be added to the contacts for joining the device to another device.

However, while the process of FIG. 2 addresses the problems of the prior art, particularly those caused by the superstrate, that process does not remedy the other problems in the prior art. For example, alignment between the features on the two sides of the wafer must still be properly carried out, so there is still a risk of damage to the optical devices, particular as densities of devices per chip increase.

Thus, we have developed a fabrication technique for creating top emitting/receiving/modulating structures, such as VCSELS, detectors or modulators, that can be closely integrated with electronic circuits. It allows alignment-dependent processing to occur only on the top side of the optical devices, thus reducing, if not eliminating, the need for backside alignment processing in which precision elements on two sides of a wafer have to be aligned relative to each other.

Since new VCSEL developments are first implemented in top-emitting devices, our approach allows use of the newest technologies, for example, the present 1310 micron or 1500 micron wavelength VCSELs.

In addition, through use of the teachings of the invention, costs are lowered because, instead of having to fabricate special purpose devices, the devices can be procured from multiple vendors as "off-the-shelf" items.

Our approach can also result in improved product lifetimes and overall yields since industry standard semiconductor processing techniques are used in the individual fabrication steps.

By employing the teachings of the invention, a higher density of interconnects is possible. As a result, in some implementations, the invention allows for close interconnect spacing, for example as close as a 20 micron pitch in current technologies and smaller in the future.

In addition, by forming interconnections through the substrate, interconnection points are not limited to the periphery of the chip. The entire otherwise unused surface is available for potential interconnections.

By employing the teachings of the invention, more direct interconnects between driver circuits and optical devices can be made. This lowers the resistance, capacitance and inductance of the interconnect. As a result, parasitics are reduced, making for lower power and drive requirements and increased device speed.

In addition, manufacturability is improved because the interconnects can be fabricated when the optical device is either in die or wafer form. Moreover, in either case, the interconnects can be fabricated in the die or wafer all at once. Alternatively, in alternative variants, a similar technique can be used where both the optical devices and electronic chips are individual dies, where the optical devices are on dies and will be connected onto a driver circuit wafer, or where the optical devices and driver circuits are still both in wafer form.

A further advantage is that the vias, that are used to form the connections, can be fabricated during optical device manufacturing. In addition, substrate removal is simple and the process does not require additional processing once the substrate removal occurs.

A further advantage is that the process can be straightforwardly used for integration of different combinations of acoustic, thermal, optical, mechanical sensors, and active devices together or for combining two, three or more devices/wafers/chips together.

A further advantage achievable by employing the teachings of the invention is better thermal management of top-emitting VCSELs because they are heat sinked to the driver and control circuitry.

A still further advantage achievable by employing the teachings of the invention is that incorporation of an optical coupler, face plate, MEMS detectors, optical combiners, optical splitters, lens, micro lenses or other optical or electrical devices can be accommodated during the fabrication process.

It should be understood that a further advantage of the invention is its applicability to both light-emitting and light-detecting devices.

The advantages and features described herein are a few of the many advantages and features available from representative embodiments and are presented only to assist in understanding the invention. It should be understood that they are not to be considered limitations on the invention as defined by the claims, or limitations on equivalents to the claims. For instance, some of these advantages are mutually contradictory, in that they cannot be simultaneously present in a single embodiment. Similarly, some advantages are applicable to one aspect of the invention, and inapplicable to others. Thus, this summary of features and advantages should not be considered dispositive in determining equivalence. Additional features and advantages of the invention will become apparent in the following description, from the drawings, and from the claims.

DETAILED DESCRIPTION

Commonly assigned U.S. patent application Ser. Nos. 09/896,189, 09/897,160, 09/896,983, 09/897,158 and 09/896,665, all filed Jun. 29, 2001, are all incorporated herein by reference. Commonly assigned U.S. Provisional Patent Application Serial No. 60/365,998 and U.S. Provisional Patent Application Serial No. 60/366,032, both filed Mar. 19, 2002, are also incorporated herein by reference.

We have developed a process in which top side emitting lasers, top side receiving detectors, or top side processed modulators (hereafter referred to collectively as "topside optical devices"), are created so that they can be easily integrated onto electronic chips.

In overview, in accordance with the invention, the process of forming topside devices that can be integrated with electronics and do not suffer from the problems of the prior art involves etching deep trenches from the top side down into the substrate of the device containing wafer, patterning dielectrics and conductors on the walls of the trenches so that the conductors extend all the way to the bottoms of the trenches. The substrate is then thinned either just down to the point where the bottom of the conductor region in the trench is exposed or until a small hole connects the thinned side of the substrate to the trench, while leaving enough remaining substrate to protect the topside optical devices from damaging levels of stresses.

Figure 1:
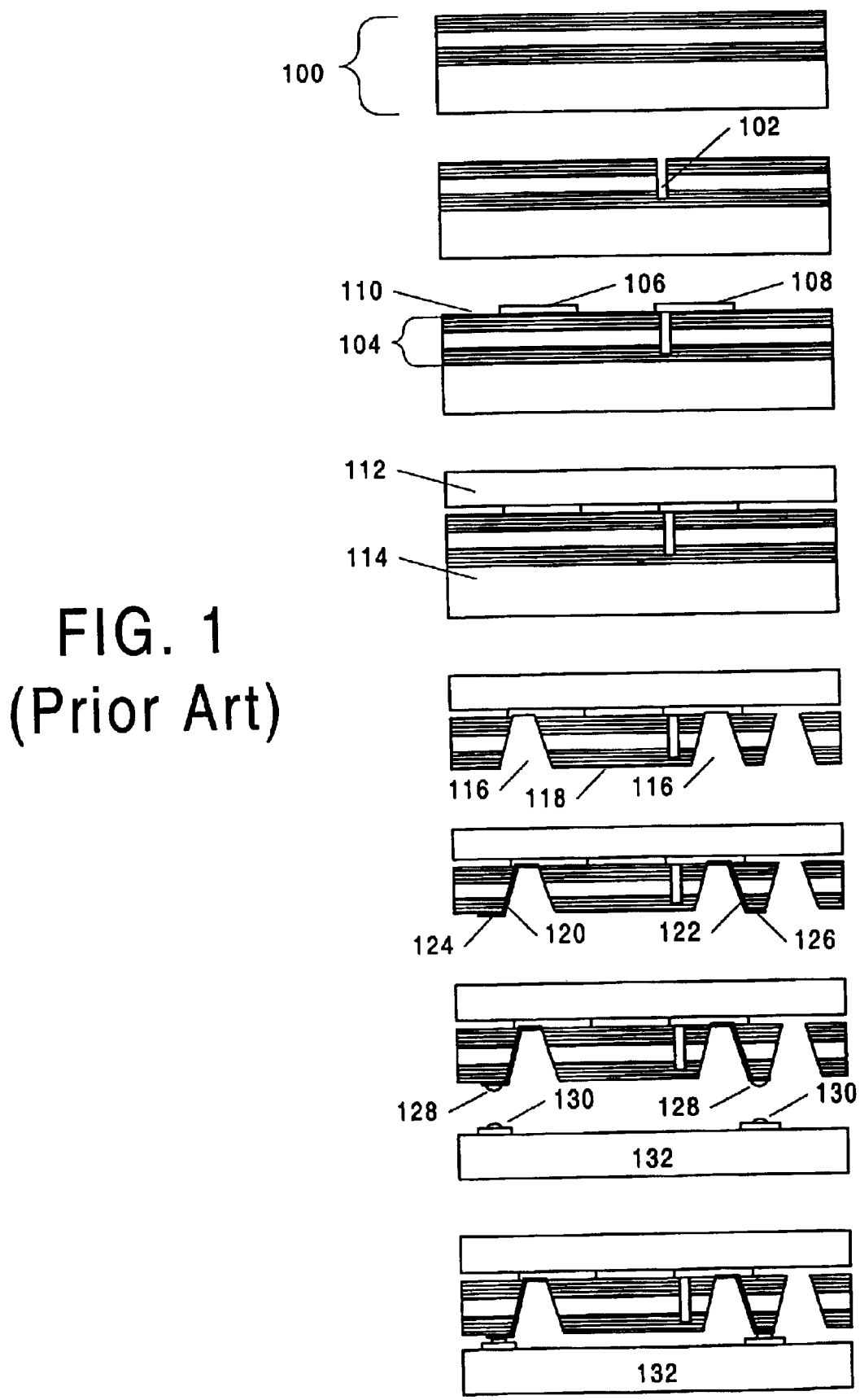
FIG. 1 is a prior art approach to integrating a top side active device with electronics.
Figure 2:
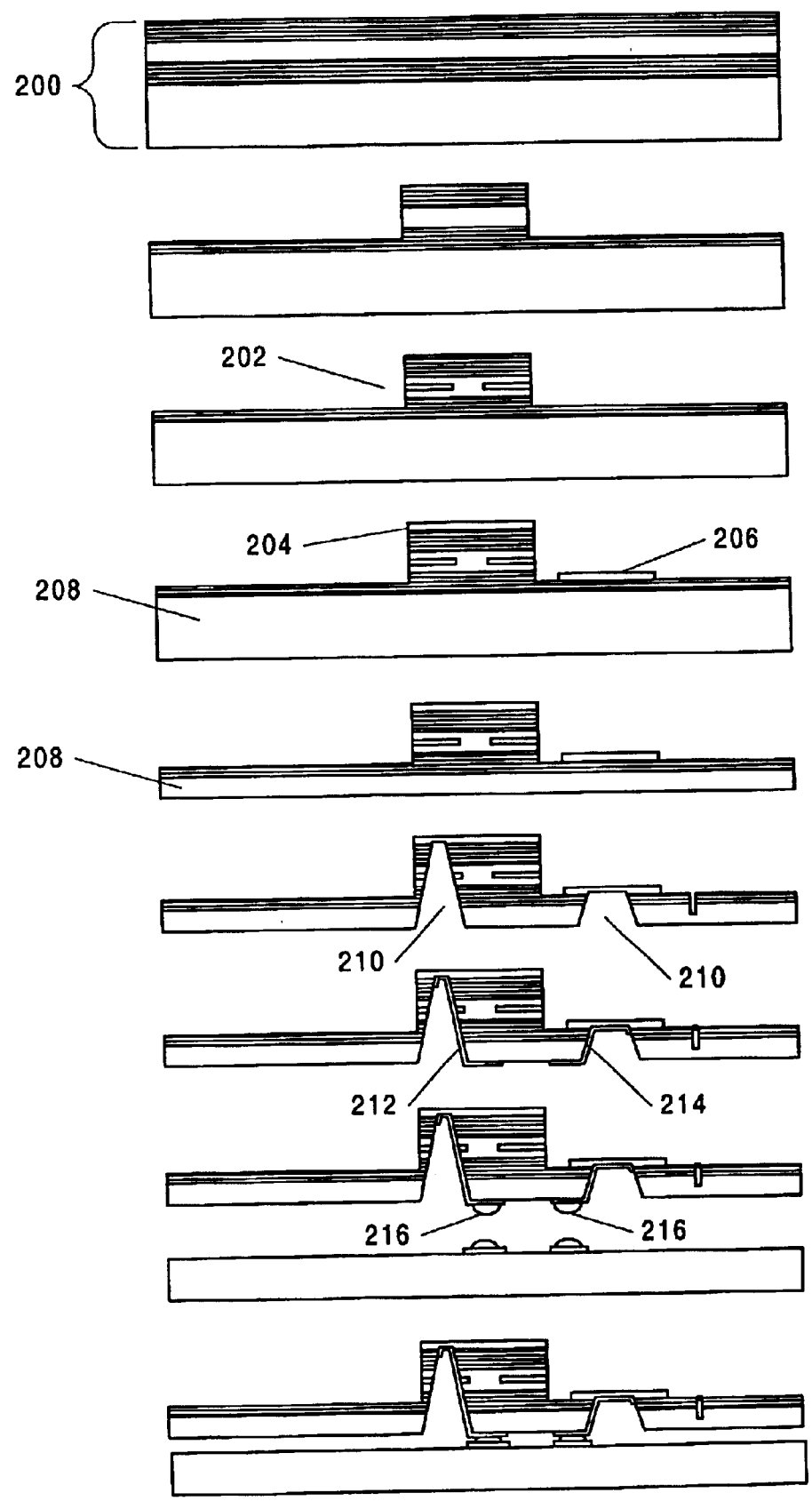
FIG. 2 is an example of an example approach to integrating a top side active device with electronics.
Figure 3:
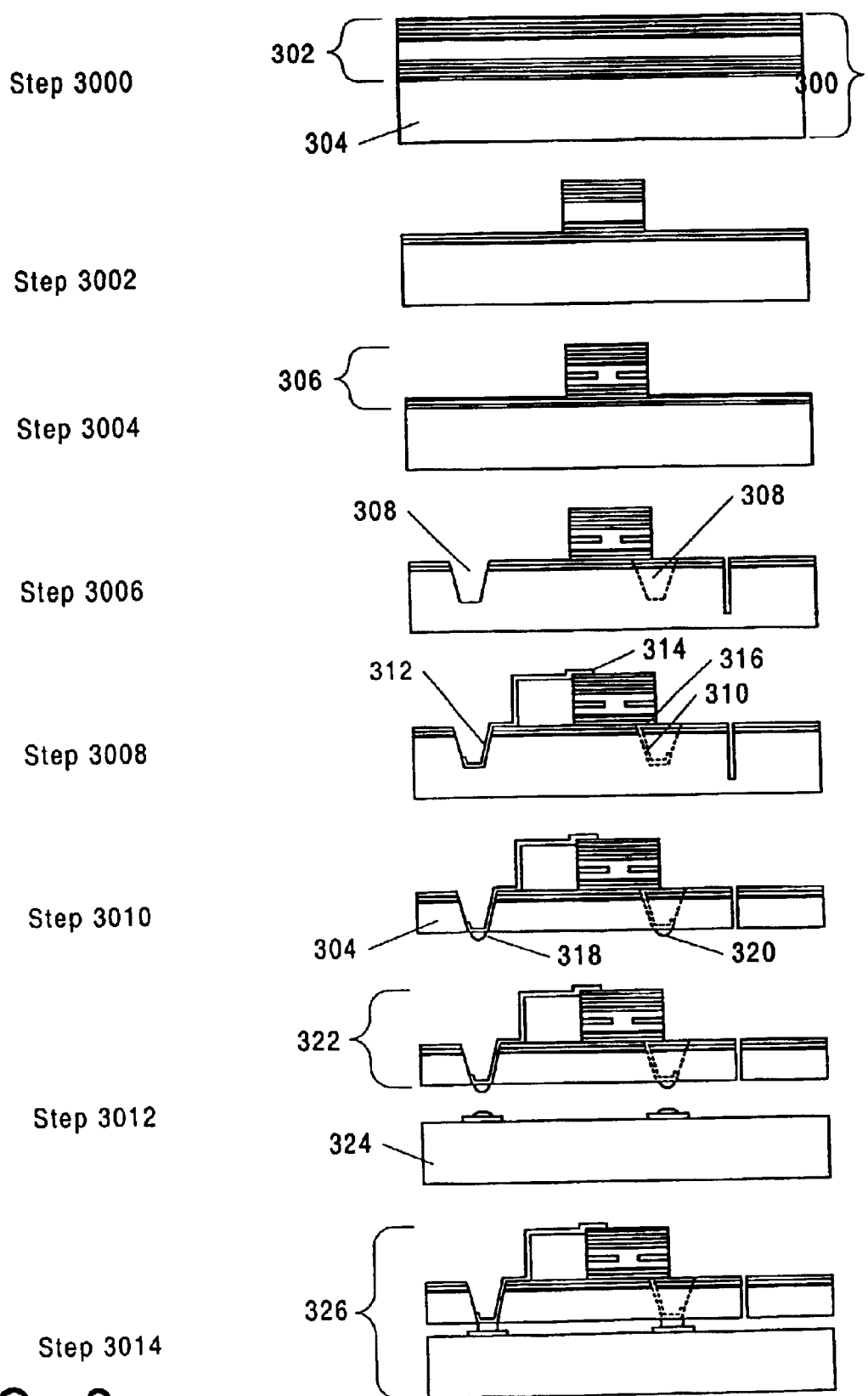
FIG. 3 is an example of a process for forming a topside active optical device in accordance with the teachings of the invention.

With that overview, an overall example process for forming a topside optical device, in accordance with the teachings of the invention, will now be presented in detail with reference to FIG. 3.

As shown in FIG. 3, an optical wafer 300 containing epitaxial layers 302 on a substrate 304 is a meaningful starting point (Step 3000) for this example.

The optical devices 306 (only one of which is shown) are defined, for example, with a combination of doping, patterning, etching, oxidation and metalization (Steps 3002, 3004).

Deep trenches 308 are etched from the top side of the wafer into the substrate, for example, between about 20 microns and about 150 microns or more or so into the substrate, making sure that the profile of the trenches are acceptable to maintain good coverage of a later deposited conductor (for example, by having the slope of the wall be either vertical or inward tapering (looking from the top) rather than an outward tapering).

Dielectric material (not shown), if shorting is a concern, and conductors 310, 312 are deposited to form positive and negative device contacts 314, 316 (one of which is obscured from view in FIG. 3) for the topside optical device. In an alternative variant, the substrate can be used as one of the contacts, in which case only one deep trench need be made. Similarly, if a three or four terminal device, for example, a combination laser-detector device, laser-modulator, or lasermodulator-detector, is created then enough vias or trenches 308 are made to allow formation of contacts for all of the appropriate points on the topside optical devices (e.g. a four terminal structure would need four or fewer trenches, depending upon whether the substrate was used as a contact or if it is possible to combine several of the contacts in a single trench).

Next, the substrate 304 is thinned to the point where the conductors on the bottom of the trenches are exposed so that contacts 318, 320 are formed, or can be put, on the bottom of the wafer.

At this point, the topside optical device 322 is capable of being closely integrated with an electronic chip 324, for example, containing drive and control circuitry.

At some point later, the joining of the topside optical device 322 and the electronic chip 324 optical wafers forms an integrated optical unit.

In some variants, a polymer, for example polyimide, or a spun-on glass are added to the trenches after the contacts have been made or after the joining to add strength and/or prevent damage to the contacts.

In another alternative variant, the processing proceeds as described above except, the thinning of the substrate does not stop when the conductor layer is reached. Instead, the thinning continues until there is a hole in the conductor layer. This difference is illustrated in FIGS. 4A and 4B that contrasts this variant's approach to that of FIG. 3

Figures 4A, 4B:
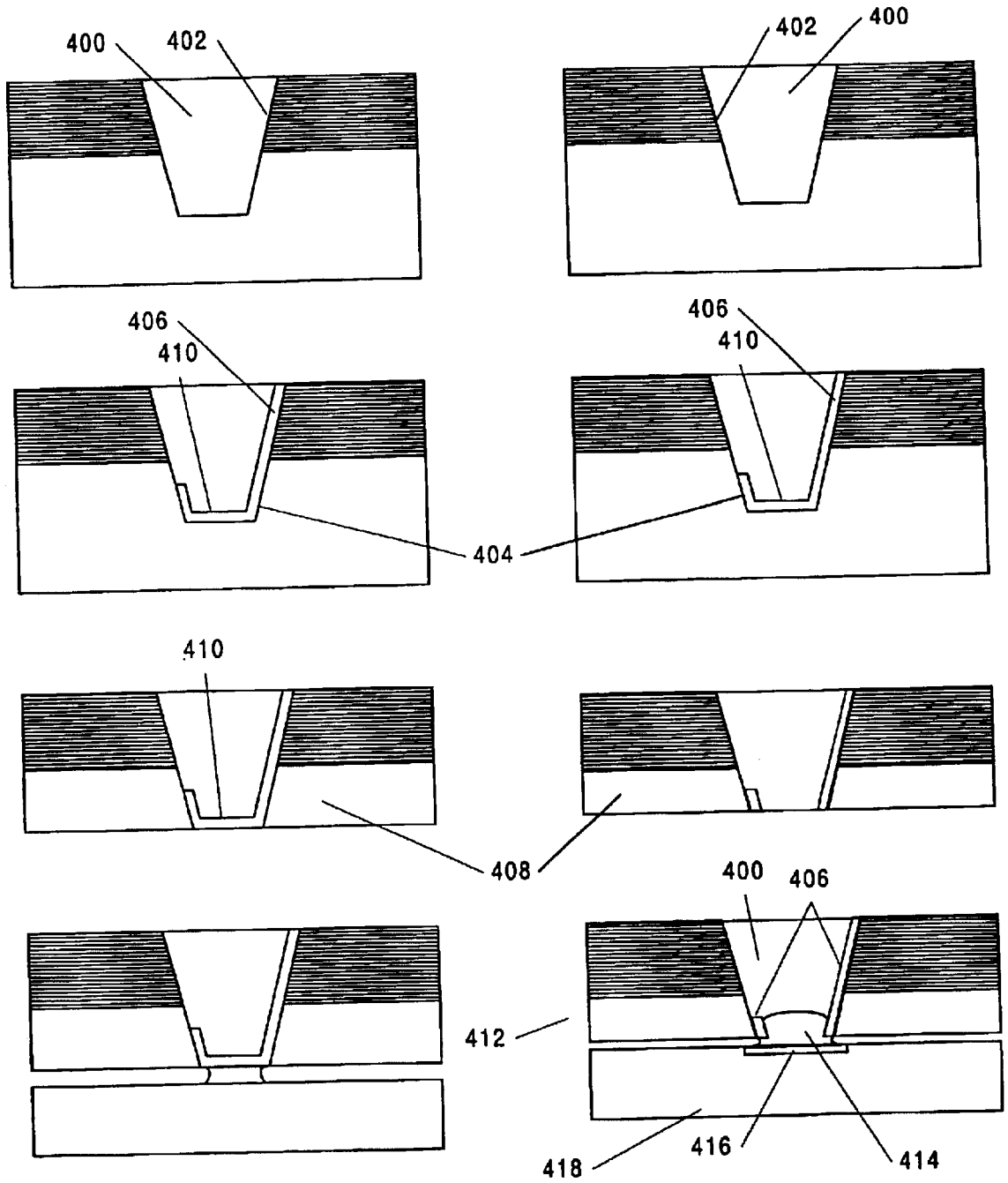
FIG. 4A is an cutaway side view of a portion of a device wafer processed in accordance with the FIG. 3 variant of the invention.
FIG. 4B shows an alternative variant of the process of FIG. 3.

FIG. 4A is a cutaway side view of a portion of a device wafer processed in accordance with the FIG. 3 variant of the invention. In FIG. 4A, the hole 400 is made to have tapered walls 402. Insulating dielectric 404 and conductors 406 are added. The substrate 408 is then thinned. However, as shown in FIG. 4A, the thinning stops at a point between when the conductor 406 is exposed and a point prior to breaching the conductor inner surface 410.

In contrast, as shown in FIG. 4B, the thinning continues until there is an actual opening in the inner surface 410 of the conductor 406 (and any dielective that may be present on the surface).

By processing according to this variant, when the topside optical device 412 is brought into contact with a solder 414 on the mating contact 416 of an electronic chip 418, and the solder 414 is melted, capillary action will draw the melted solder 414 up into the cavity 400.

This provides at least two benefits. First, the passage of the solder into the hole will tend to draw the two pieces towards each other and into alignment. Thus, to some extent this variant is self aligning. Second, the drawing of the solder into the hole helps ensure a good electrical connection is made between the two devices.

Figure 5:
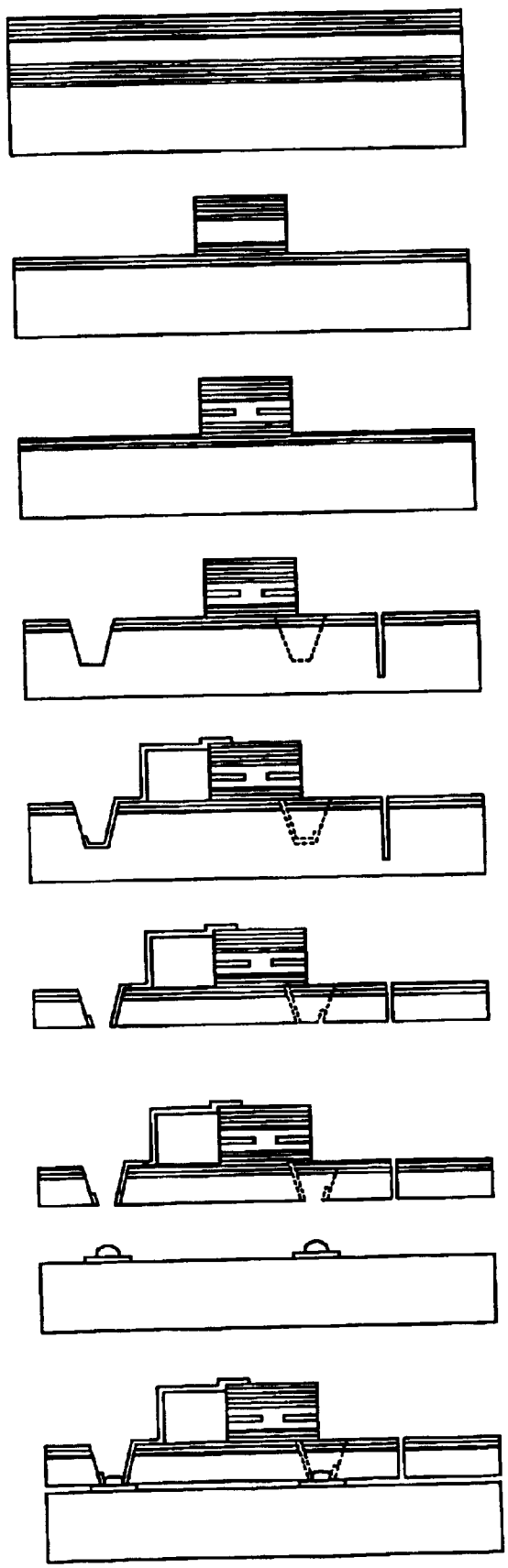
FIG. 5 is an example of an alternative variant of a process for forming a topside active optical device in accordance with the teachings of the invention.
Figure 6:
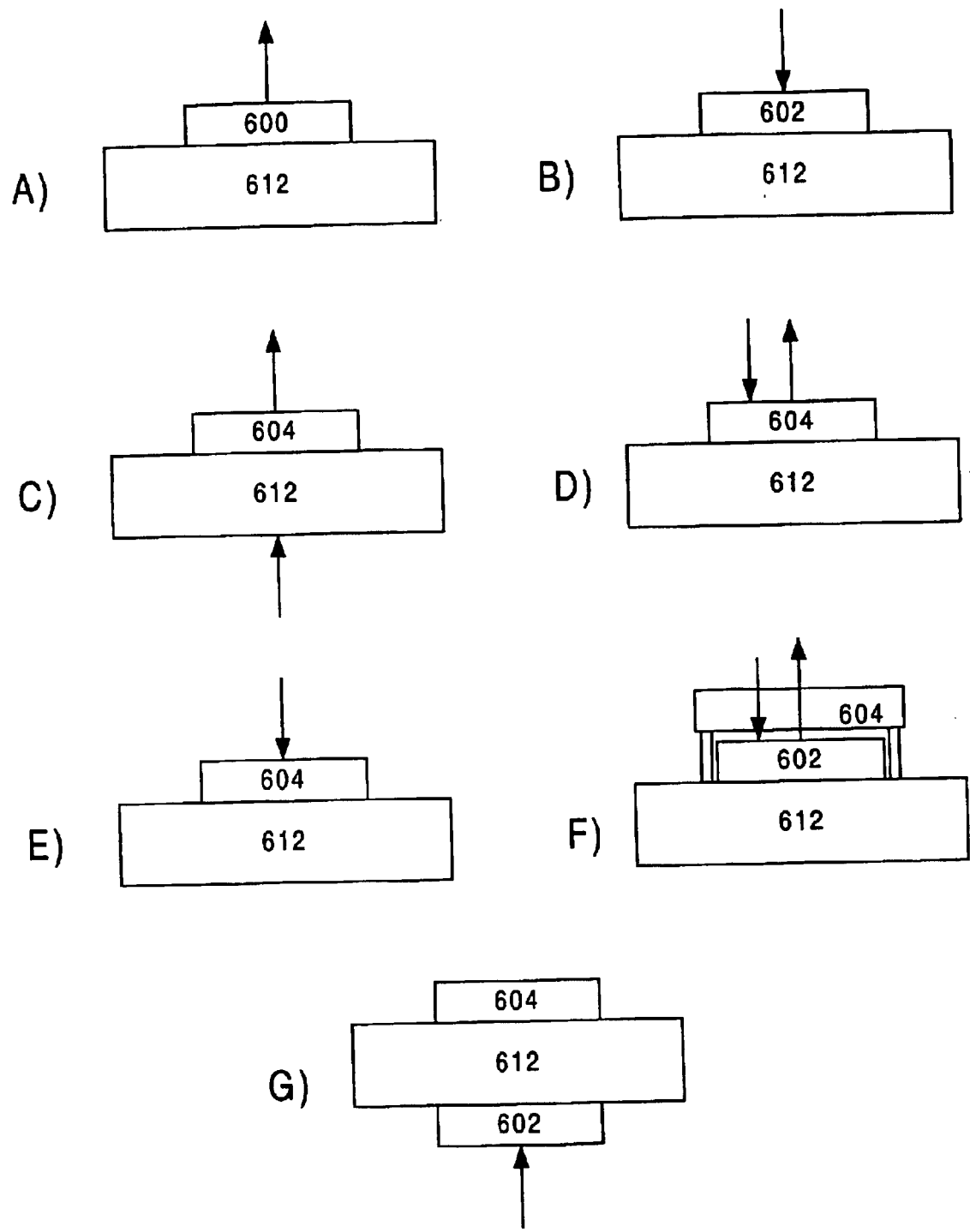
FIGS. 6A through 6G are examples of configurations of units that can be made using devices created in accordance with the teachings of the invention.

FIG. 5 is an example of an overall process similar to that of FIG. 3 except it is an example of a variant employing the technique of FIG. 4B.

FIGS. 6A through 6G show some of the many configurations of devices that can be formed according to the present invention involving a topside optical device, for example a topside active laser 600, a topside active detector 602 or a topside processed modulator 604, according to the present invention, in conjunction with other laser 606, detector 608 or modulator 610 devices relative to a substrate 612 of the topside optical device.

It should be understood that the above description is only representative of illustrative embodiments. For the convenience of the reader, the above description has focused on a representative sample of all possible embodiments, a sample that teaches the principles of the invention. The description has not attempted to exhaustively enumerate all possible variations. That alternate embodiments may not have been presented for a specific portion of the invention, or that further undescribed alternate embodiments may be available for a portion, is not to be considered a disclaimer of those alternate embodiments. One of ordinary skill will appreciate that many of those undescribed embodiments incorporate the same principles of the invention and others are equivalent.

What is claimed is:

1. A method of integrating multiple topside active laser devices, each having electrical contacts on a top side, with an electronic chip having electrical contacts on a connection side, the method comprising:

creating a trench, defined by a wall, from the top side of a wafer containing the topside active laser devices into a substrate of the wafer;

making a portion of the wall conductive by applying a conductive material to the portion;

thinning the substrate to expose the conductive material; and attaching the topside active laser devices to the electronic chip by bringing the wafer into close proximity to the electronic chip such that the conductive material will electrically bond the wafer to the electronic chip.

2. A method of creating a self aligning topside optical device that can be joined to another device by comprising:

creating a trench, defined by a wall, in a topside optical device on a wafer, the topside optical device having electrical contacts on a top side; from the top side of the wafer into a substrate of the wafer;

making a portion of the wall conductive by applying a conductive material to the portion; and thinning an outer surface of the substrate until a thru hole is formed in the conductive material connecting the outer surface with the trench for use in alignment between the topside optical device and the other device.

3. A device comprising:

a topside optical device formed by the method of one of claims 1 or 2.

4. An integrated device comprising:

a topside active optical device formed on a wafer, the wafer including a substrate having a first thickness at a time when the topside active optical device is formed, the topside active optical device having an electrical contact on a top side;

an electronic chip having electrical contacts on a connection side;

a wall defining a trench extending from the top side of the wafer containing the topside optical device into the substrate of the wafer;

a conductor comprising: a conductive material on a portion of the wall and a conductive bonding material, the conductor extending from the electrical contact on the top side of the optical device to one contact on the connection side of the electronic chip, causing alignment between the topside active optical device and the electronic chip while establishing an electrically conductive path there-between; and wherein the substrate of the integrated device has an integration thickness less than the first thickness when the electrically conductive path is established.

5. A self aligning topside optical device for integration with an other device comprising:

a wall defining a trench in a wafer having a topside laser optical device thereon, the topside optical device having an electrical contact on a top side, and an electrically conductive layer on at least a portion of the trench extending from the top side of the wafer through a substrate of the wafer to define an opening on an external surface of the substrate opposite the device so that the layer forms an electrically conductive path from the electrical contact through the substrate to the opening on the external surface; and the opening being sized so that when a device contact on the other device has a solder material thereon and the solder material is brought into contact with the opening and the solder is softened, at least some of the solder will flow into the opening and align the opening with the contact and form an electrically conductive path between the electrical contact and the device contact.

* * * * *